(12) United States Patent
Funamoto et al.

(10) Patent No.: US 6,974,635 B1
(45) Date of Patent: Dec. 13, 2005

(54) PACKAGE FOR ELECTRONIC COMPONENT, LID MATERIAL FOR PACKAGE LID, AND PRODUCTION METHOD FOR LID MATERIAL

(75) Inventors: Kenichi Funamoto, Osaka (JP); Hidetoshi Noda, Toyonaka (JP); Masaaki Ishio, Osaka (JP)

(73) Assignee: Neomax Materials Co., Ltd., Osaka (JP)

( * ) Notice: Subject to any disclaimer, the term of this patent is extended or adjusted under 35 U.S.C. 154(b) by 0 days.

(21) Appl. No.: 09/395,179

(22) Filed: Sep. 14, 1999

(30) Foreign Application Priority Data

Sep. 24, 1998 (JP) ................................. 10-268863
Aug. 2, 1999 (JP) ................................. 11-218310

(51) Int. Cl.⁷ ....................... B32B 15/04; B32B 15/18; H01L 21/48; H05K 5/06
(52) U.S. Cl. ..................... 428/609; 428/600; 428/621; 428/680; 438/126; 174/50.5; 174/52.3; 257/704
(58) Field of Search ............................... 428/621, 34.1, 428/615, 680, 681, 679, 600, 940, 673, 609; 174/52.1, 50.5, 52.3, 52.4; 427/58; 438/121, 438/125, 126; 257/704; 220/200; 228/124.6

(56) References Cited

U.S. PATENT DOCUMENTS

| | | | |
|---|---|---|---|
| 4,257,156 A | | 3/1981 | Houston ...................... 29/580 |
| 4,666,796 A | | 5/1987 | Levine ........................ 428/670 |
| 4,737,418 A | * | 4/1988 | Slattery ...................... 428/672 |
| 5,361,971 A | * | 11/1994 | Williams et al. ............. 228/193 |
| 6,110,808 A | * | 8/2000 | Saito ........................... 438/471 |
| 6,229,190 B1 | * | 5/2001 | Bryzek et al. ............... 257/419 |

FOREIGN PATENT DOCUMENTS

| | | |
|---|---|---|
| GB | 2 073 082 A | 10/1981 |
| JP | 57-143847 | 9/1982 |
| JP | 60-39249 | 3/1985 |
| JP | 63-51661 | 3/1988 |
| JP | 06053341 | 2/1994 |
| JP | 8-46075 | 2/1996 |
| JP | 09199622 | 7/1997 |
| JP | 9-246415 | 9/1997 |
| WO | WO 94/24702 | 10/1994 |

OTHER PUBLICATIONS

Office Action dated Mar. 7, 2000.

(Continued)

*Primary Examiner*—Michael E. LaVilla
(74) *Attorney, Agent, or Firm*—Keating & Bennett, LLP

(57) ABSTRACT

A lid material is provided which comprises: a core layer composed of an Fe—Ni alloy or an Fe—Ni—Co alloy; a nickel-based (Ni-based) metal layer press- and diffusion-bonded onto the core layer and composed of a Ni-based metal, such as pure Ni, mainly comprising Ni; and a brazing material layer press-bonded onto the Ni-based metal layer. The Ni-based metal layer has a maximum-to-minimum thickness ratio T1/T2 of 1.4 to 15. The lid material is produced by press-bonding a Ni-based metal foil onto a core sheet for formation of the Ni-based metal layer on the core layer, then diffusion-annealing the Ni-based metal layer and the core layer, and press-bonding a brazing material foil onto the Ni-based metal layer with a reduction ratio of 30 to 65%.

14 Claims, 2 Drawing Sheets

OTHER PUBLICATIONS

Partial Translation of Japanese Utility Model Laid-Open No. 60-39249, (Mar. 1985).

Partial Translation of Japanese Patent Laid-Open No. 63-51661, (Mar. 1988).

English language version of Office Action from European Patent Office in European Patent Application No. 99 118 476.3-1524, cover page and pp. 1-3, May 2002.

* cited by examiner

PACKAGE FOR ELECTRONIC COMPONENT, LID MATERIAL FOR PACKAGE LID, AND PRODUCTION METHOD FOR LID MATERIAL

BACKGROUND OF THE INVENTION

1. Field of the Invention

The present invention relates to a package for housing an electronic component. The invention also relates to a lid material for a package lid and to a production method for the lid material.

2. Description of Related Art

Packages for housing various electronic components such as semiconductor devices (ICs) and piezoelectric vibrators generally comprise a case having an open top and a housing space for the electronic components, and a lid fuse-bonded to a peripheral upper surface of the case for hermetically sealing the housing space.

The lid comprises a core plate such as formed of an iron-nickel (Fe—Ni) alloy, nickel (Ni) layers formed on opposite surfaces of the core plate, and a brazing material layer formed on one of the Ni layers by press-bonding a brazing material foil onto the Ni layer. The formation of the Ni layers is conventionally achieved by plating the core plate with Ni.

The package is assembled by placing the lid on the top of the case with the brazing material layer of the lid facing the open top of the case, and heating the lid to melt the brazing material layer so that the lid is fuse-bonded to the peripheral upper surface of the case. Exemplary methods for the heating of the lid are to hold a heating device in contact with the lid, to heat a case-and-lid assembly in a hot oven, and to irradiate the lid with an electron beam or a laser beam.

Since the Ni layer of the lid is formed by the Ni plating, formation of pin holes in the Ni layer and contamination with an impurity such as an additive contained in a plating solution are inevitable. The pin holes present in the Ni layer are not completely crushed when press-bonding the brazing material foil onto the Ni layer, so that micro-holes remain in the Ni layer. The impurity present in the Ni layer reduces the ductility of Ni, so that micro-cracks are liable to develop in the Ni layer during the press-bonding of the brazing material foil.

The presence of the micro-holes and the micro-cracks in the Ni layer tends to result in non-uniform fuse-bonding of the lid to the case. If a non-uniform fuse-bonded portion is formed, the portion permits communication between the inside and outside of the case. Further, the micro-holes and the micro-cracks present in the Ni layer of the lid facing the opening of the case permit easy communication between the inside and outside of the case. This reduces the hermeticity of the package in which the electronic components are housed. With a recent rapid increase in precision and complexity of electronic components, packages for the electronic components are required to have a higher hermeticity.

SUMMARY OF THE INVENTION

It is an object of the present invention to provide a lid material and a production method therefor which can impart a higher hermeticity to a package for an electronic component, and to provide an electronic component package which features a higher hermeticity.

The lid material production method according to the present invention comprises the steps of: press-bonding a foil of a nickel-based (Ni-based) metal mainly comprising Ni onto a core sheet for formation of an Ni-based metal layer on a core layer; diffusion-annealing the core layer and the Ni-based metal layer for diffusion-bonding the Ni-based metal layer onto the core layer; and press-bonding a brazing material foil onto the Ni-based metal layer with a reduction ratio of 30 to 65% for formation of a brazing material layer on the Ni-based metal layer after the diffusion-annealing step.

In the production method according to the invention, the formation of the Ni-based metal layer is achieved by press-bonding the Ni-based metal foil onto the core sheet, so that the Ni-based metal layer is free from formation of pin holes and contamination with an impurity during the formation of the Ni-based metal layer. Therefore, neither micro-hole nor micro-crack is formed in the Ni-based metal layer. In addition, the diffusion-bonding of the Ni-based metal layer onto the core layer ensures satisfactory adhesion therebetween. Further, the press-bondability between the Ni-based metal layer and the brazing material layer is good enough to ensure satisfactory adhesion therebetween when the brazing material layer is fused. Therefore, an electronic component package having a higher hermeticity can be provided by employing a lid formed of the lid material.

In the production method according to the present invention, the core sheet to be used in the Ni-based metal foil press-bonding step is preferably composed of an iron-nickel-based (Fe—Ni-based) alloy mainly comprising Fe and Ni. Where the core sheet of the Fe—Ni-based alloy is used, the diffusion-annealing step is preferably performed at an annealing temperature of not lower than 800° C. for an annealing period of not shorter than two minutes or at an annealing temperature of not lower than 900° C. for an annealing period of not shorter than one minute. The brazing material foil to be used in the brazing material foil press-bonding step is preferably composed of a soft brazing material having a melting point of not higher than 450° C. and, more preferably, free from lead (Pb).

The lid material according to the present invention comprises: a core layer; an Ni-based metal layer press- and diffusion-bonded onto the core layer and composed of an Ni-based metal mainly comprising Ni; and a brazing material layer press-bonded onto the Ni-based metal layer; wherein the Ni-based metal layer has a maximum-to-minimum thickness ratio T1/T2 of 1.4 to 15.

The Ni-based metal layer of the lid material according to the present invention is free from micro-holes and micro-cracks. Since the Ni-based metal layer is diffusion-bonded onto the core layer, satisfactory adhesion therebetween is ensured. Further, the press-bondability between the Ni-based metal layer and the brazing material layer is good enough to ensure satisfactory adhesion therebetween when the brazing material layer is fused. Therefore, an electronic component package having an excellent hermeticity can be provided by employing a lid formed of the lid material.

The core layer of the lid material according to the present invention is preferably composed of an Fe—Ni-based alloy mainly comprising Fe and Ni. The brazing material layer is preferably composed of a soft brazing material having a melting point of not higher than 450° C. and, more preferably, free from Pb.

The electronic component package according to the present invention comprises: a case having an open top and a housing space for an electronic component; and a lid provided on the top of the case. The lid comprises: a core layer; an Ni-based metal layer press- and diffusion-bonded onto the core layer and composed of an Ni-based metal mainly comprising Ni; and a brazing material layer press-bonded onto the Ni-based metal layer, wherein the Ni-based metal layer has a maximum-to-minimum thickness ratio T1/T2 of 1.4 to 15, wherein the brazing material layer is fuse-bonded to a peripheral upper surface of the case.

In accordance with the present invention, the lid has substantially the same construction as the lid material of the present invention described above. Therefore, the package obtained by fuse-bonding the lid to the case has a higher hermeticity, thereby extending the service life of the electronic component housed therein. In the present invention, the core layer is preferably composed of an Fe—Ni-based alloy mainly comprising Fe and Ni. Further, the brazing material layer is composed of a soft brazing material having a melting point of not higher than 45° C. and, more preferably, free from Pb.

BRIEF DESCRIPTION OF THE DRAWINGS

The foregoing and other objects, features and effects of the present invention will become more apparent from the following description of the preferred embodiments with reference to the attached drawings, in which.

DETAILED DESCRIPTION OF THE PREFERRED EMBODIMENTS

Figure 1:
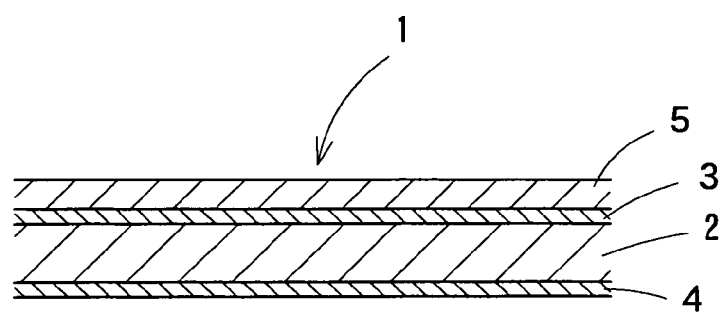
FIG. 1 is a partial sectional view illustrating the basic construction of a lid material to be produced through a lid material production method according to an embodiment of the present invention.

With reference to FIG. 1, an explanation will first be given to the basic construction of a lid material to be produced through a lid material production method according to one embodiment of the present invention. The lid material 1 comprises a core layer 2, nickel-based (Ni-based) metal layers 3, 4 formed on upper and lower surfaces of the core layer 2, and a brazing material layer 5 formed on one (an upper one in FIG. 1) 3 of the Ni-based metal layers. Typically, the core layer 2 has a thickness of about 80 to 1,000 μm, and the Ni-based metal layers 3, 4 each have a thickness of about 5 to 50 μm. Further, the brazing material layer 5 has a thickness of about 10 to 200 μm. The Ni-based metal layer 4 formed on the lower surface of the core layer 2 imparts the lower surface with an improved corrosion resistance. The provision of the Ni-based metal layer 4 is optional, and is not necessarily required.

Next, the lid material production method according to the present invention will be described on the basis of a method of producing the lid material 1 having the aforesaid basic construction. The lid material 1 is produced through the steps of: press-bonding foils of a nickel-based (Ni-based) metal mainly comprising Ni on upper and lower surfaces of a core sheet for formation of the Ni-based metal layers on the opposite surfaces of the core layer; diffusion-annealing the core layer and the Ni-based metal layers for diffusion-bonding the Ni-based metal layers onto the core layer; and press-bonding a brazing material foil onto one of the Ni-based metal layers for formation of the brazing material layer on the Ni-based metal layer. For convenience of explanation, the brazing material foil is herein press-bonded onto the upper Ni-based metal layer.

A material for the core sheet to be used in the Ni-based metal foil press-bonding step is preferably an iron-nickel-based (Fe—Ni-based) alloy which mainly comprises Fe and Ni and has an excellent bondability to the Ni-based metal and a low thermal expansion coefficient. The Fe—Ni-based metal preferably comprises not lower than 20 wt % Ni and not lower than 50 wt % Fe. As required, the Fe—Ni-based metal may further comprise a suitable quantity of an element, such as not higher than 20 wt % of cobalt (Co), which is capable of providing a solid solution with Fe and Ni to reduce the thermal expansion coefficient without deteriorating the bondability to the Ni-based metal. Exemplary Fe—Ni-based alloys which have a thermal expansion coefficient equivalent to that of a ceramic material often used as a principal material for a case for housing an electronic component are an Fe—Ni—Co alloy comprising 20 to 30 wt % Ni, 1 to 20 wt % Co and the balance Fe, and an Ni—Fe alloy comprising 36 to 50 wt % Ni and the balance Fe.

Examples of the Ni-based metal for the Ni-based metal foil include pure Ni and Ni—Cu alloys comprising not lower than 50 wt % Ni. The Ni-based metal has an excellent press-bondability to the Fe—Ni-based alloy as the preferable material for the core sheet and to the brazing material foil, and is highly resistant to corrosion. The Ni-based metal has an excellent wettability with a molten brazing material, thereby ensuring satisfactory adhesion to the brazing material. More specifically, when a lid formed of the lid material 1 is fuse-bonded to a peripheral upper surface of a case in which an electronic component is housed, the brazing material layer is melted so that the brazing material uniformly spreads over the surface of the Ni-based metal layer 3. The brazing material, after solidification, gas-tightly adheres onto the Ni-based metal layer 3.

In the Ni-based metal foil press-bonding step, a reduction ratio is preferably about 40 to 80% based on the total thickness of a stack of the core sheet and the Ni-based metal foils. The reduction ratio is herein defined as a thickness reduction ratio for a single press operation, and expressed by the following equation:

Reduction Ratio (%)=($h1-h2$)/$h1$×100 wherein h1 is the thickness of the stack before the press operation and h2 is the thickness of the stack after the press operation.

In the diffusion-annealing step, the Ni-based metal layers are bonded to the core layer in their junction interfaces on the atom level through the diffusion-annealing, so that the adhesion therebetween and the gas-tightness of the junction interfaces can be improved. Further, the diffusion-annealing reduces or eliminates a working strain caused in the Ni-based metal layers in the Ni-based metal foil press-bonding step, thereby improving the ductility of the Ni-based metal layers. Therefore, variations in the thickness of the Ni-based metal layer 3 can be suppressed which may occur when the soft brazing material foil is press-bonded onto the hard Ni-based metal layer 3 in the brazing material foil press-bonding step. This prevents the Ni-based metal layer 3 from being locally formed with thinner portions, in which microcracks are liable to develop.

In the diffusion-annealing step, the annealing isrried out at an annealing temperature of not lower than 800° C. for an annealing period of not shorter than two minutes, preferably not shorter than four minutes, or at an annealing temperature of not lower than 90° C. for an annealing period of not shorter than one minute, preferably not shorter than three minutes. Under such annealing conditions, the Ni-based metal layer can assuredly be diffusion-bonded onto the core layer of the Fe—Ni-based alloy in a shorter time. The upper limit of the annealing temperature may be lower than the lower one of the melting points of the core sheet material and the Ni-based metal, and is preferably not higher than 1,150° C. The upper limit of the annealing period is not particularly defined, but may be not longer than ten minutes, preferably not longer than five minutes, in consideration of the production efficiency.

In the brazing material foil press-bonding step, the brazing material foil is press-bonded onto the upper Ni-based metal layer formed on the core layer with a reduction ratio of 30 to 65%. The reduction ratio is based on the total thickness of a stack of the core layer, the Ni-based metal layers and the brazing material foil. The Ni-based metal layers are softened through the diffusion-annealing. Therefore, even if the soft and highly ductile brazing material foil is press-bonded onto the Ni-based metal layer, the Ni-based metal layer is less liable to experience thickness variations, so that development of micro-cracks in a minimum thickness portion of the Ni-based metal layer can be prevented. If the reduction ratio is lower than 30%, the bondability of the brazing material foil to the Ni-based metal layer is remarkably deteriorated. On the other hand, if the reduction ratio is higher than 65%, the variations in the thickness of the Ni-based metal layer are increased even though the Ni-based metal layer is softened during the diffusion-annealing. Hence, there is a possibility that micro-cracks may develop in a thinner portion of the Ni-based metal layer. In addition, lubrication between the brazing material foil and a press tool such as a press roll becomes insufficient during the press operation, thereby damaging the surface of the press tool (e.g., causing the brazing material to stick on the press tool) and roughening the surface of the brazing material layer. With a remarkably roughened surface, the brazing material layer has a poor fuse-bondability. Therefore, the reduction ratio is preferably 30 to 65%, more preferably 40 to 60%, particularly preferably 45 to 55%. The reduction ratio in the brazing material foil press-bonding step means a reduction ratio to be employed in the first press operation for the press-bonding of the brazing material foil onto the Ni-based metal layer, and reduction ratios for the second and subsequent press operations may properly be determined depending on a thickness requirement for the lid material.

Usable as the brazing material for the brazing material foil are soft brazing materials (solder materials) and hard brazing materials, but it is preferred to use a soft brazing material which has a melting point of not higher than 450° C., preferably not higher than 350° C., more preferably not higher than 300° C. The soft brazing material can be melted at a lower heating temperature when a lid of a predetermined size formed of the lid material 1 is fuse-bonded onto the peripheral upper surface of the case in which the electronic component is housed. Therefore, thermal effects on the electronic component housed in the case can be suppressed.

Examples of the soft brazing material include Sn—Ag alloys, Bi—Ag alloys, In—Ag alloys, Zn—Ag alloys, Sn—Au alloys, Pb—Sn alloys, Pb—Sn—Ag alloys and Pb—Sn—Ag—In alloys, among which the Pb-free alloys are preferred for prevention of environmental pollution. Among these soft brazing materials, eutectic alloys are also preferred because phase transition from solid to liquid and vice versa quickly occurs at their eutectic points. Specific examples of the eutectic alloys as the soft brazing materials include an Sn—Ag alloy (eutectic point: 221° C.) comprising 3.5 wt % Ag and the balance Sn, a Bi—Ag alloy (eutectic point: 262° C.) comprising 2 wt % Ag and the balance Bi, an In—Ag alloy (eutectic point: 156° C.) comprising 2 wt % Ag and the balance In, and a Pb—Sn—Ag alloy (eutectic point: 296° C.) comprising 62 wt % Sn, 2 wt % Ag and the balance Pb.

Figure 2:
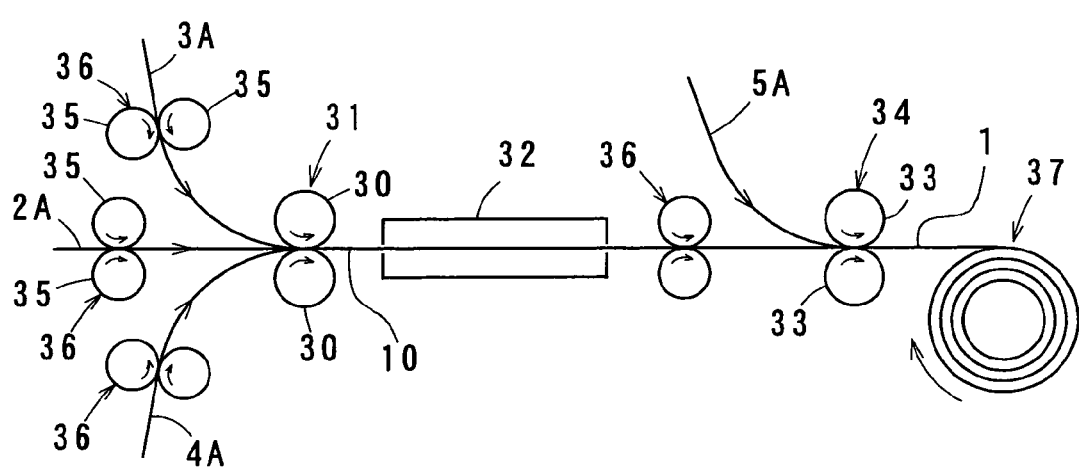
FIG. 2 is a schematic diagram illustrating a lid material production apparatus to be employed for a production method according to the present invention.

With reference to FIG. 2, there will be described a lid material production apparatus which is to be employed for the production of the lid material 1. The apparatus comprises: Ni-based metal foil press-bonding means 31 having a pair of press rolls 30, 30 for press-bonding Ni-based metal foils 3A, 4A onto opposite surfaces of a core sheet 2A reeled out of a coil while passing a stack of the core sheet 2A and the Ni-based metal foils 3A, 4A therebetween; an annealing oven 32 for diffusion-annealing the resulting laminate 10 of the core layer and the Ni-based metal layers press-bonded onto the core layer by the Ni-based metal foil press-bonding means 31; and brazing material foil press-bonding means 34 having a pair of press rolls 33, 33 for press-bonding a brazing material foil 5A onto an upper one of the Ni-based metal layers of the laminate 10 subjected to the diffusion-annealing while passing a stack of the brazing material foil 5A and the laminate 10 therebetween. The core sheet 2A, the Ni-based metal foils 3A, 4A, the brazing material foil 5A and the laminate 10 are each passed through surface activation means 36 having a pair of brush rolls 35, 35 before being supplied into the Ni-based metal foil press-bonding means 31 or the brazing material foil press-bonding means 34, so that dust and surface oxide films are removed therefrom for activation of mating surfaces thereof.

The brazing material foil 5A is press-bonded onto the laminate 10 by the brazing material foil press-bonding means 34 for formation of the brazing material layer 5, and the resulting lid material 1 is wound up by a take-up device 37. The lid material 1 in a coil form is, as required, reeled off and cut into a predetermined size for use as a lid for an electronic component package. Where the Ni-based metal layer 3 is to be formed only on the upper surface of the core layer 2, the Ni-based metal foil 4A to be supplied to the lower side of the core sheet 2A is unnecessary.

Figure 3:
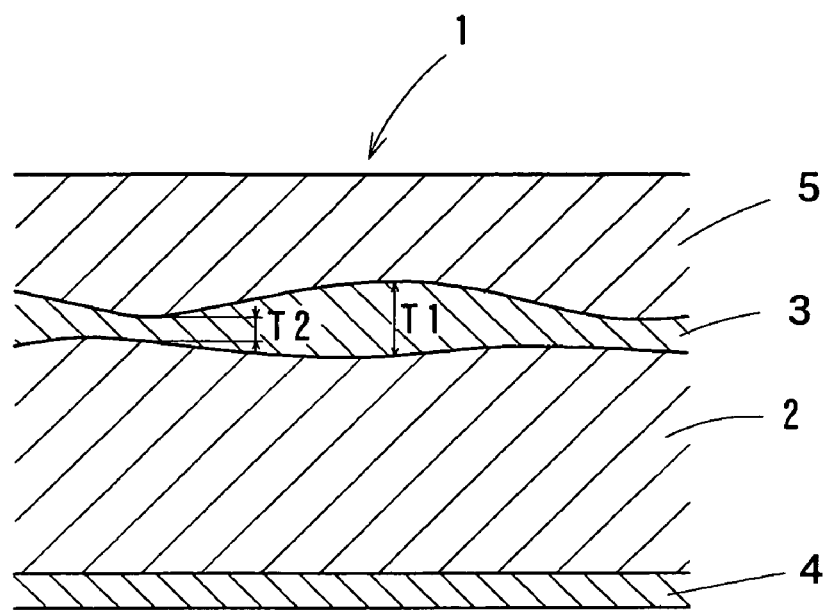
FIG. 3 is a partial enlarged sectional view illustrating a lid material according to another embodiment of the present invention.

As described above, the reduction ratio at the first press operation in the brazing material foil press-bonding step influences the bondability of the brazing material foil to the Ni-based metal layer, the thickness variations of the Ni-based metal layer, the development of micro-cracks in the minimum thickness portion of the Ni-based metal layer, and the surface state of the brazing material layer. As a result of careful observation of the thickness variations of the Ni-based metal layer of the lid 1 produced in accordance with the aforesaid production method, the inventors of the present invention have found a fact that the bondability between the brazing material layer 5 and the Ni-based metal layer 3, the integrity of the Ni-based metal layer 3 and the surface state of the brazing material layer 5 can be improved where the Ni-based metal layer 3 on which the brazing material layer 5 is formed has a given ratio T1/T2 of the maximum thickness T1 to the minimum thickness T2 thereof (maximum-to-minimum thickness ratio T1/T2) as shown in FIG. 3.

In accordance with another embodiment of the present invention on the basis of the aforesaid fact, a lid material 1 comprises: a core layer 2; Ni-based metal layers 3, 4 press- and diffusion-bonded onto the core layer 2; and a brazing material layer 5 press-bonded onto an upper one 3 of the Ni-based metal layers, wherein the Ni-based metal layer 3 has a maximum-to-minimum thickness ratio T1/T2 of 1.4 to 15.

Since the formation of the Ni-based metal layers 3, 4 of the lid material 1 is achieved by press- and diffusion-bonding Ni-based metal foils onto the core layer 2, the Ni-based metal layers are free from micro-holes and micro-cracks which may otherwise occur when the Ni-based metal layers are formed by plating. Further, the diffusion-bonding between the core layer 2 and the Ni-based metal layers 3, 4 ensures satisfactory adhesion therebetween. Since the Ni-based metal layer 3 has a maximum-to-minimum thickness ratio T1/T2 of 1.4 to 15, an excellent press-bondability between the Ni-based metal layer 3 and the brazing material layer 5 can be ensured. Even if the Ni-based metal layer 3 is relatively thin, the development of micro-cracks in the Ni-based metal layer can be prevented in the press-bonding of the brazing material foil. With a ratio T1/T2 of lower than 1.4, the bondability between the Ni-based metal layer 3 and the brazing material layer 5 is deteriorated, so that the brazing material layer is liable to be peeled off. With a ratio T1/T2 of greater than 15, on the other hand, the Ni-based metal layer 3 may suffer from the development of micro-cracks in its minimum thickness portion if the layer 3 is relatively thin. In addition, the surface of a press tool may be damaged during a press operation, and the brazing material layer 5 may have a rough surface. Therefore, the Ni-based metal layer 3 preferably has a maximum-to-minimum ratio T1/T2 of 1.4 to 15, more preferably 2.0 to 10.

In this embodiment, the core layer 2 of the lid material 1 is preferably composed of an Fe—Ni-based alloy mainly comprising Fe and Ni as previously described. Further, the brazing material layer 5 is preferably composed of a soft brazing material having a melting point of not higher than 450° C., and more preferably composed of a Pb-free soft brazing material.

Figure 4:
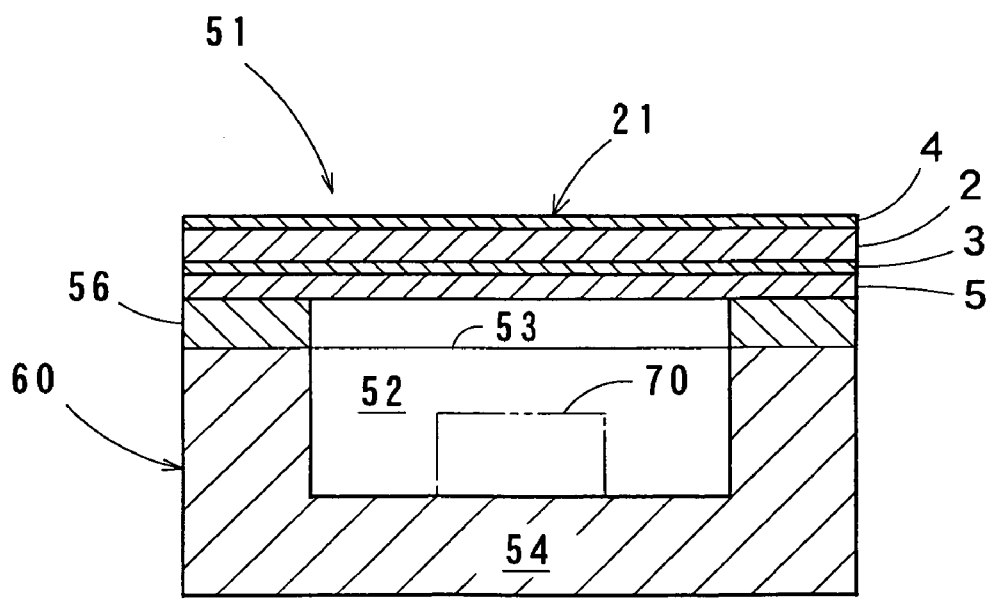
FIG. 4 is a sectional view illustrating the basic construction of an electronic component package according to further another embodiment of the present invention.

With reference to FIG. 4, an explanation will be given to an electronic component package having a lid 21 produced by cutting the lid material 1 into a predetermined size in accordance with further another embodiment of the present invention. Since the lid 21 comprises the same components as the lid material 1, the like components are denoted by the like reference numerals in FIG. 4, and no explanation will be given thereto.

The package 51 comprises: a case 60 including a case body 54 having a housing space 52 for an electronic component 70 and an open top 53 communicating with the housing space 52, and a fusion-bond promotion layer 56 provided on a peripheral upper surface of the case body 54 for permitting easy fusion-bonding between the upper surface and a brazing material; and a lid 21 provided on the top of the case 60, wherein the brazing material layer 5 of the lid 21 is fusion-bonded to the upper surface of the fusion-bond promotion layer 56.

In this embodiment, the case body 54 is composed of a ceramic material having a small thermal expansion coefficient. Therefore, the lid material 2 for the lid 21 is preferably composed of an Fe—Ni alloy or an Fe—Ni—Co alloy which has a thermal expansion coefficient equivalent to that of the ceramic material for the case body 54. The fusion-bond promotion layer 56 includes a metallization layer of a high melting point metal such as tungsten (W) or molybdenum (Mo) which has been sintered integrally with the case body 54, and a precious metal layer provided on the metallization layer and composed of a precious metal such as gold (Au). For improvement of the bondability between the metallization layer and the precious metal layer, an Ni layer may be provided therebetween. The case body may be provided as a sintered body of a high melting point metal. In this case, the provision of the metallization layer may be obviated.

Since the lid 21 of the electronic component package 51 has substantially the same construction as the lid material 1 described above, the adhesion between the core layer 2 and the Ni-based metal layers 3, 4 and between the Ni-based metal layer 3 and the brazing material layer 5 is satisfactory, and the Ni-based metal layer 3 is free from micro-holes and micro-cracks. Therefore, the package 51 has an excellent hermeticity, so that the service life of the electronic component housed in the package 51 can be extended.

The present invention will hereinafter be described in greater detail by way of examples thereof. It should be understood that the scope of the present invention be not limited by the aforesaid embodiments and the following examples.

EXAMPLES

Example 1

A 20-mm wide and 650-$\mu$m thick sheet of an Fe—Ni—Co alloy comprising 29 wt % Ni, 17 wt % Co and the balance Fe was prepared for use as a core sheet, and 20-mm wide and 40-$\mu$m thick pure Ni foils were prepared for use as Ni-based metal foils. The Ni-based metal foils 3A, 4A were superposed on opposite surfaces of the core sheet 2A, and the resulting stack was roll-pressed with a reduction ratio of 73% by the Ni-based metal foil press-bonding means 31 of the production apparatus shown in FIG. 2. Through this roll press operation, a laminate 10 of a 176-$\mu$m thick core layer and 11-$\mu$m thick Ni-based metal layers press-bonded onto the opposite surfaces of the core layer was obtained. A plurality of such laminates 10 were prepared in this manner, and diffusion-annealed under various annealing conditions in the annealing oven 32.

After the diffusion-annealing, the laminates 10 were subjected to a peel test for the Ni-based metal layers. In the peel test, a peel force per unit width (1 mm) required for separation of the Ni-based metal layer from the core layer was measured. The bondability between the core layer and the Ni-based metal layer was evaluated on the basis of the peel force. The results are shown in Table 1. In table 1, a symbol ⊙ denotes a case where the separation was impossible because the Ni-based metal layer and the core layer were completely alloyed in the junction interface therebetween; a symbol ○ denotes a case where a peel force of not smaller than 10 kgf was required for the separation; a symbol Δ denotes a case where a peel force of not smaller than 5 kgf and smaller than 10 kgf was required for the separation; and a symbol χ denotes a case where a peel force of smaller than 5 kgf was required for the separation. Laminates having a peel strength of not smaller than 5 kgf are practicable. As can be understood from Table 1, a satisfactory bondability was ensured when the annealing temperature was not lower than 800° C. and the annealing period (during which the laminate was retained in the oven) was not shorter than two minutes or when the annealing temperature was not lower than 900° C. and the annealing period was not shorter than one minute.

TABLE 1

| Annealing temperature(° C.) | Annealing period (min) | | | | | |
|---|---|---|---|---|---|---|
| | 1 | 2 | 3 | 4 | 5 | 6 |
| 600 | X | X | X | X | X | X |
| 700 | X | X | X | X | Δ | Δ |
| 800 | X | Δ | Δ | ○ | ○ | ○ |
| 900 | Δ | Δ | ○ | ⊙ | ⊙ | ⊙ |
| 1,000 | Δ | ○ | ⊙ | ⊙ | ⊙ | ⊙ |
| 1,100 | ○ | ⊙ | ⊙ | ⊙ | ⊙ | ⊙ |
| 1,150 | ⊙ | ⊙ | ⊙ | ⊙ | ⊙ | ⊙ |

Next, a laminate annealed at 800° C. for two minutes and a laminate annealed at 900° C. for one minute were used for production of lid materials. A 20-mm wide and 80-μm thick brazing material foil 5A of a Pb—Sn alloy comprising 60 wt % Sn and the balance Pb was superposed on one of the Ni-based metal layers of each laminate, and the resulting stack was roll-pressed with a reduction ratio of 40% by the brazing material foil press-bonding means 33. As a result, as shown in FIG. 1, a lid material 1 was obtained which comprised the core layer 2 with its thickness reduced to about 105 μm, the Ni-based metal layers 3, 4 formed on the opposite surfaces of the core layer 2 with their thicknesses each reduced to about 7 μm on average, and a brazing material layer 5 formed on the Ni-based metal layer 3 and having an average thickness of about 48 μm.

A test strip was cut out of the lid material 1, and its section was microscopically observed. The junction between the brazing material layer 5 and the Ni-based metal layer 3 was in a proper state. The Ni-based metal layer 3 was examined in the following manner. The brazing material layer 5 was removed from the test strip through a chemical treatment, and the surface of the Ni-based metal layer 3 was observed wholly at a 50× magnification and partially at a 100× magnification by an optical microscope so as to be checked for development of cracks. As a result, no micro-crack was observed on the Ni-based metal layer 3. Further, the thickness ratio of the Ni-based metal layer 3 was determined in the following manner. A section of the test strip was photographed at a 400× magnification via an optical microscope, and the maximum thickness T1 and minimum thickness T2 of the Ni-based metal layer 3 were measured for determination of the thickness ratio T1/T2 as shown in FIG. 3. As a result, the Ni-based metal layer 3 had a thickness ratio within a range between 2.0 and 3.0.

Example 2

Lid materials 1 according to Example 2 had a basic construction as shown in FIG. 1. An Fe—Ni—Co alloy comprising 29 wt % Ni, 17 wt % Co and the balance Fe was used as the material for a core layer, a pure Ni was used as a Ni-based metal, and a Pb—Sn—Ag alloy comprising 62 wt % Sn, 2 wt % Ag and the balance Pb and an Sn—Ag alloy comprising 2 wt % Ag and the balance Sn were each used as a soft brazing material.

The lid materials 1 were each produced by the lid material production apparatus shown in FIG. 2. For the production of the lid material 1 by the production apparatus, a 20-mm wide and 1,300-μm thick core sheet 2A, 20-mm wide and 200-μm thick Ni-based metal foils 3A, 4A and a 20-mm wide and 100-μm thick brazing material foil 5A were used.

The Ni-based metal foils 3A, 4A were superposed on opposite surfaces of the core sheet 2A, and the resulting stack was roll-pressed with a reduction ratio of 65% by the Ni-based metal foil press-bonding means 31. Through this roll press operation, a laminate 10 of a 450-μm thick core layer and 70-μm thick Ni-based metal layers press-bonded onto the opposite surfaces of the core layer was obtained. The laminate 10 was diffusion-annealed at 1,000° C. for three minutes. The brazing material foil 5A was superposed on the laminate 10 subjected to the diffusion-annealing, and the resulting stack was roll-pressed once with a reduction ratio based on the total thickness of the stack as shown in Table 2 for press-bonding the brazing material foil 5A onto the Ni-based metal layer.

Test strips were cut out of each of the lid materials 1 thus produced, and checked for the bondability between the Ni-based metal layer 3 and the brazing material layer 5 and for the development of micro-cracks in the Ni-based metal layer 3. Further, the surface of the brazing material layer 5 was visually inspected, and variations in the thickness of the Ni-based material layer 3 were measured for determination of the maximum-to-minimum thickness ratio T1/T2 of the Ni-based metal layer 3.

For the check of the bondability, a 100-mm long test strip cut out of the lid material 1 was used. The test strip was bent 180 along a center line with its longitudinally opposite edges overlapped, and the bent portion of the test strip was held between fingers. Then, the test strip was restored to its initial state, and the bent portion was visually checked for separation of the brazing material layer 5. The check for the development of micro-cracks in the Ni-based metal layer 3 and the determination of the thickness ratio of the Ni-based metal layer 3 were carried out in the same manner as in Example 1.

The results are shown in Table 2. For the rating of the bondability of the brazing material layer in Table 2, a symbol ○ denotes a case where the brazing material layer 5 was not raised nor separated from the Ni-based metal layer 3, and a symbol χ denotes a case where the brazing material layer 5 was raised and separated from the Ni-based metal layer 3. For the rating of the surface state of the brazing material layer in Table 2, a symbol ○ denotes a case where the surface of the brazing material layer 5 was not roughened, and a symbol χ denotes a case where the brazing material layer 5 was roughened. The development of micro-cracks was observed in none of Samples No. 1 to No. 10 and, hence, this is not shown in Table 2. It is noted that Samples No. 1, No. 2 and No. 10 in Table 2 are comparative examples.

TABLE 2

| Sample No. | Brazing material | Reduction ratio (%) | Bondability of brazing material layer | Surface state of brazing material layer | T1/T2 |
|---|---|---|---|---|---|
| 1* | Pb—Sn—Ag | 20 | x | o | 1.1 |
| 2* | Pb—Sn—Ag | 25 | x | o | 1.2 |
| 3 | Pb—Sn—Ag | 30 | o | o | 1.4 |
| 4 | Pb—Sn—Ag | 40 | o | o | 2.0 |
| 5 | Sn—Ag | 45 | o | o | 3.0 |
| 6 | Pb—Sn—Ag | 50 | o | o | 4.0 |
| 7 | Sn—Ag | 55 | o | o | 7.0 |
| 8 | Pb—Sn—Ag | 60 | o | o | 10 |
| 9 | Pb—Sn—Ag | 65 | o | o | 15 |
| 10* | Pb—Sn—Ag | 70 | o | x | 25 |

Samples suffixed with * are comparative examples.

As can be seen from Table 2, Samples No. 1 and No. 2 which were produced with a reduction ratio of not higher than 25% suffered from a poor bondability between the Ni-based metal layer 3 and the brazing material layer 5, so that such lid materials would supposedly present a hermeticity problem. On the contrary, Samples No. 3 to No. 10 which were produced with a reduction ratio of 30 to 70% exhibited a satisfactory bondability between the Ni-based metal layer 3 and the brazing material layer 5. However, Sample No. 10 which was produced with a reduction ratio of 70% had a rough surface on the brazing material layer 5 because the brazing material foil stuck on the surface of the press roll in the brazing material foil press-bonding step.

The observation of the sections of the lid materials 1 indicated that, where the reduction ratio was in the range of 30 to 65%, the thickness ratio T1/T2 of the Ni-based metal layer 3 was 1.4 to 15. Although there were thickness variations of the Ni-based metal layer 3, no micro-crack developed even in the minimum thickness portion of the Ni-based metal layer 3, and the brazing material layer 5 had a good surface state. In the case of Sample No. 10, the thickness ratio T1/T2 was 25, but no micro-crack developed in the Ni-based metal layer 3. This was supposedly because the Ni-based metal layer 3 had a relatively great average thickness.

Next, cases 60 were prepared which each comprised a ceramic case body 54 and a fusion-bond promotion layer 56 having a W metallization layer, an Ni layer and an Au layer provided in this order on a peripheral upper surface of the case body 54 as shown in FIG. 4. The case had an exterior size of 15 mm×10 mm×10 mm (length×width× height) with a housing space 52 having a size of 9 mm×4 mm×7 mm (length×width×height). The lid materials 1 of Samples No. 3 to No. 9 were each cut into the same plan size as that of the case 60 for preparation of a lid 21. The lid 21 was placed on the case 60 with the brazing material layer 5 of the lid brought in contact with the peripheral upper surface of the case, and then the resulting assembly was heated at 310°° C. (Samples No. 3, No. 4, No. 6, No. 8 and No. 9) or at 240° C. (Samples No. 5 and No. 7) in a helium gas atmosphere for fuse-bonding the lid 21 onto the case 60.

Packages thus fabricated were placed in a vacuum vessel, which was in turn evacuated by an ion pump. Then, the exhaust gas was checked for the presence of helium gas at the ultimate vacuum pressure. As a result, no helium gas was detected. Thus, it was confirmed that these packages were excellent in hermeticity.

The entire disclosure of Japanese Patent Application No. 11-218310 filed on Aug. 2, 1999 including specification, claims, drawings and summary are incorporated herein by reference in its entirety.

What is claimed is:

1. A lid material for a lid which is to be fuse-bonded to a peripheral upper surface of a case having an open top and a housing space for an electronic component, the lid material comprising:
   a core layer;
   a nickel-based metal layer composed of a nickel-based metal mainly comprising nickel, an entire thickness of the nickel-based metal layer being press- and diffusion-bonded onto the core layer; and
   a brazing material layer press-bonded onto the nickel-based metal layer such that the total thickness of the core layer, the nickel-based metal layer, and the brazing material layer is reduced by a ratio of between about 30% to about 60%;
   wherein the nickel-based metal layer has a maximum-to-minimum thickness ratio T1/T2 of 1.4 to 15.

2. A lid material as set forth in claim 1, wherein the core layer is composed of an iron-nickel-based alloy mainly comprising iron and nickel.

3. A lid material as set forth in claim 1, wherein the brazing material layer is composed of a soft brazing material having a melting point of not higher than 450° C.

4. A lid material as set forth in claim 2, wherein the brazing material layer is composed of a soft brazing material having a melting point of not higher than 450° C.

5. A lid material as set forth in claim 3, wherein the soft brazing material is free from lead.

6. A lid material as set forth in claim 1, wherein the soft brazing material is free from lead.

7. A lid material as set forth in claim 1, wherein the brazing material layer is roll-pressed onto the nickel-based metal layer.

8. An electronic component package comprising:
   a case having an open top and a housing space for an electronic component; and
   a lid provided on the top of the case, the lid comprising a core layer, a nickel-based metal layer composed of a nickel-based metal mainly comprising nickel, an entire thickness of the nickel-based metal layer being press- and diffusion-bonded onto the core layer, and a brazing material layer press-bonded onto the nickel-based metal layer such that the total thickness of the core layer, the nickel-based metal layer, and the brazing material layer is reduced by a ratio of between about 30% to about 60%, the nickel-based metal layer having a maximum-to-minimum thickness ratio T1/T2 of 1.4 to 15;
   wherein the brazing material layer of the lid is fuse-bonded to a peripheral upper surface of the case.

9. An electronic component package as set forth in claim 8, wherein the core layer is composed of an iron-nickel-based alloy mainly comprising iron and nickel.

10. An electronic component package as set forth in claim 8, wherein the brazing material layer is composed of a soft brazing material having a melting point of not higher than 450° C.

11. An electronic component package as set forth in claim 10, wherein the brazing material layer is composed of a soft brazing material having a melting point of not higher than 450° C.

12. An electronic component package as set forth in claim 10, wherein the soft brazing material is free from lead.

13. An electronic component package as set forth in claim 11, wherein the soft brazing material is free from lead.

14. An electronic component package as set forth in claim 8, wherein the brazing material layer is roll-pressed onto the nickel-based metal layer.

* * * * *